United States Patent
Tunks et al.

(10) Patent No.: US 10,076,067 B2
(45) Date of Patent: Sep. 11, 2018

(54) SYSTEM AND METHOD OF CONTROLLING AN AIR MOVER

(71) Applicant: Dell Products L.P., Round Rock, TX (US)

(72) Inventors: Eric M. Tunks, Austin, TX (US); William K. Coxe, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/814,021

(22) Filed: Nov. 15, 2017

(65) Prior Publication Data

US 2018/0077823 A1    Mar. 15, 2018

Related U.S. Application Data

(62) Division of application No. 13/738,765, filed on Jan. 10, 2013, now Pat. No. 9,854,716.

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |
| *G06F 1/20* | (2006.01) |

(52) U.S. Cl.
CPC .......... *H05K 7/20836* (2013.01); *G06F 1/20* (2013.01); *G06F 1/206* (2013.01); *Y02B 60/1275* (2013.01); *Y02D 10/16* (2018.01)

(58) Field of Classification Search
CPC . G06F 1/20; G06F 1/203; G06F 1/206; Y02D 10/16
USPC ...... 361/679.46, 679.48, 679.49, 679.5, 689, 361/679.31; 700/282, 299, 300
See application file for complete search history.

(56) References Cited

U.S. PATENT DOCUMENTS

| | | | |
|---|---|---|---|
| 6,243,656 B1 | 6/2001 | Arai et al. | |
| 6,597,135 B2 | 7/2003 | Smith et al. | |
| 7,054,721 B2* | 5/2006 | Malone | G06F 1/20 700/300 |
| 7,138,781 B2 | 11/2006 | Murray et al. | |
| 7,139,169 B2* | 11/2006 | Alperin | G06F 1/20 361/679.4 |
| 7,789,130 B2* | 9/2010 | Chen | F04D 27/004 165/122 |
| 8,560,132 B2* | 10/2013 | Matteson | H05K 7/20836 165/287 |
| 8,893,980 B2* | 11/2014 | Scott | F24F 11/0079 236/49.3 |
| 9,057,378 B2* | 6/2015 | Franz | F04D 27/004 |
| 2008/0310967 A1* | 12/2008 | Franz | F04D 27/004 417/32 |

(Continued)

*Primary Examiner* — Anthony Haughton
(74) *Attorney, Agent, or Firm* — Baker Botts L.L.P.

(57) ABSTRACT

A system and method of controlling a cooling fan in an information handling system is disclosed. A fan request signal is received from a component of an information handling system and a determination is made regarding whether the component is configured to operate with a cooling fan. If the component is configured to operate with the cooling fan, the fan request signal is transmitted to the cooling fan. If, on the other hand, the component is not configured to operate with the cooling fan, a revised fan request signal is generated and transmitted to the cooling fan.

7 Claims, 5 Drawing Sheets

(56) References Cited

U.S. PATENT DOCUMENTS

| | | | |
|---|---|---|---|
| 2010/0073863 A1* | 3/2010 | Matsushima | H05K 7/20245 361/679.46 |
| 2012/0010754 A1* | 1/2012 | Matteson | H05K 7/20836 700/282 |
| 2014/0198451 A1* | 7/2014 | Kuo | G01K 1/026 361/695 |

* cited by examiner

SYSTEM AND METHOD OF CONTROLLING AN AIR MOVER

RELATED APPLICATIONS

This application is a divisional of U.S. patent application Ser. No. 13/738,765 filed Jan. 10, 2013, the contents of which is incorporated by reference herein.

TECHNICAL FIELD

The present disclosure relates generally to information handling systems, and more particularly to controlling an air mover (e.g., a fan or a blower) associated with an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

SUMMARY

In one embodiment, a method of controlling a cooling fan in an information handling system is disclosed. A fan request signal is received from a component of an information handling system and a determination is made regarding whether the component is configured to operate with a cooling fan. If the component is configured to operate with the cooling fan, the fan request signal is transmitted to the cooling fan. If, on the other hand, the component is not configured to operate with the cooling fan, a revised fan request signal is generated and transmitted to the cooling fan.

In another embodiment, a cooling system of an information handling system is disclosed. The system includes a cooling fan and a management controller communicatively coupled to the cooling fan. The management controller is configured to receive a fan request signal from a component and determine whether the component is configured to operate with the cooling fan. The management controller is further configured to the fan request signal to the cooling fan if the component is configured to operate with the cooling fan, and generate and transmit a revised fan request signal to the cooling fan if the component is not configured to operate with the cooling fan.

In yet another embodiment, an information handling system including a processor, a memory communicatively coupled to the processor, a cooling fan; and a management controller communicatively coupled to the cooling fan is disclosed. The management controller is configured to receive a fan request signal from a component of the information handling system and determine whether the component of the information handling system is configured to operate with the cooling fan. The management controller is further configured to the fan request signal to the cooling fan if the component is configured to operate with the cooling fan, and generate and transmit a revised fan request signal to the cooling fan if the component is not configured to operate with the cooling fan.

BRIEF DESCRIPTION OF THE DRAWINGS

A more complete understanding of the disclosed embodiments and advantages thereof may be acquired by referring to the following description taken in conjunction with the accompanying drawings, in which like reference numbers indicate like features, and wherein.

DETAILED DESCRIPTION

Figure 1:
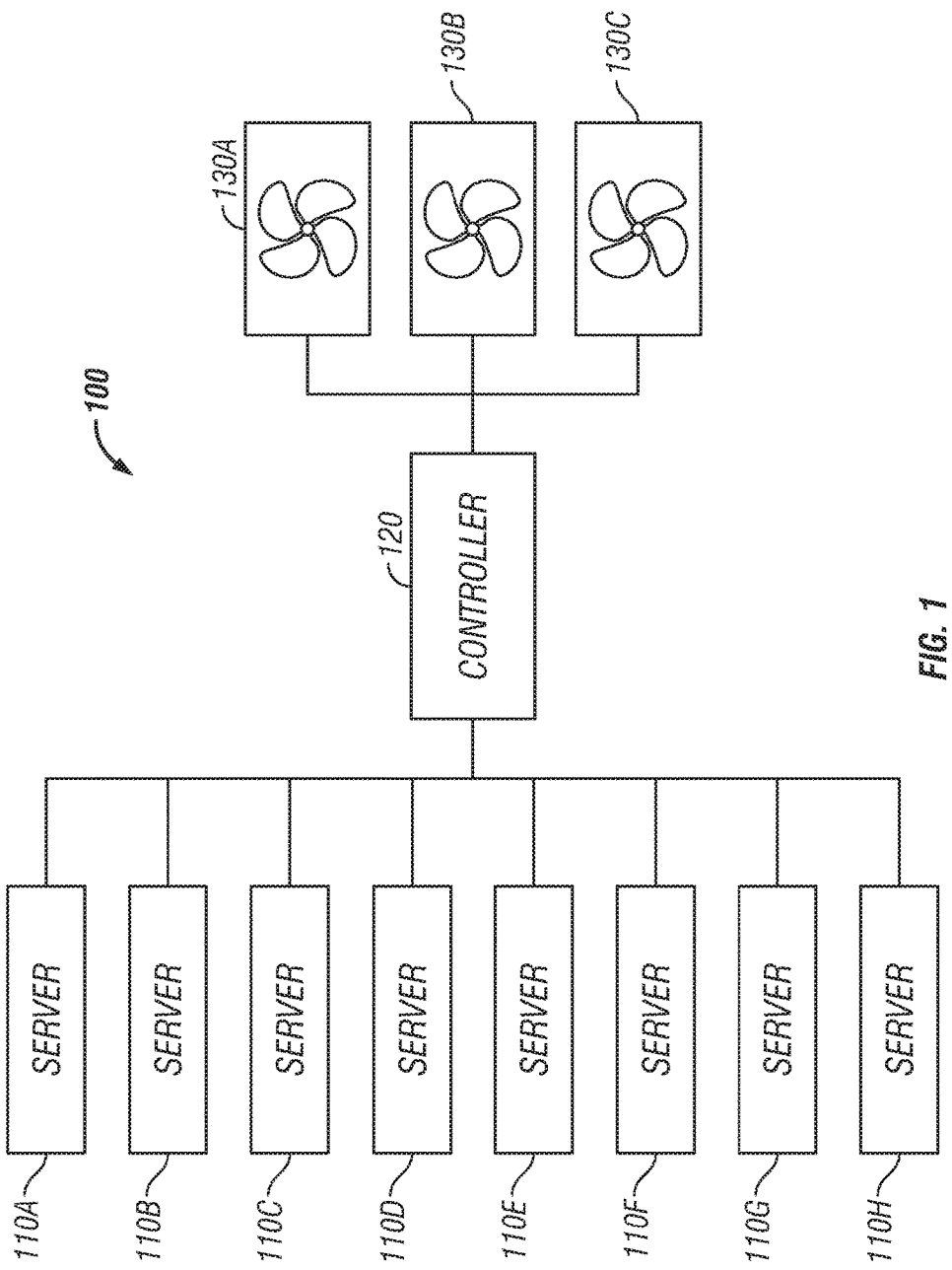
FIG. 1 illustrates a block diagram of an example information handling system, in accordance with the present disclosure.

Preferred embodiments and their advantages are best understood by reference to FIGS. 1-5, wherein like numbers are used to indicate like and corresponding parts.

For the purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components or the information handling system may include one or more disk drives, one or more network ports for communicating with external devices as well as various input and output (I/O) devices, such as a keyboard, a mouse, touchscreen and/or a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

As stated above, an information handling system may include, among other things, modular (e.g., blade) servers that utilize a common chassis infrastructure to provide shared non-core computing services, such as power, cooling, network interface, storage, etc. One potential problem with a common chassis infrastructure is that of maintaining backward compatibility with earlier generation servers, which may also be referred to as legacy blades. For example, a new generation chassis may include new features, such as higher performance fans, which may have a higher maximum fan speed as well as an associated increase in power consumption and acoustical output. In a new generation chassis with legacy blades, the higher performance fan may run at a higher speed than necessary to cool the legacy blades, resulting in an unnecessary increase in power consumption. In accordance with the teachings of this disclosure, a new generation chassis with updated cooling fans may avoid these problems by maintaining backward compatibility with legacy blades.

Figure 2A:
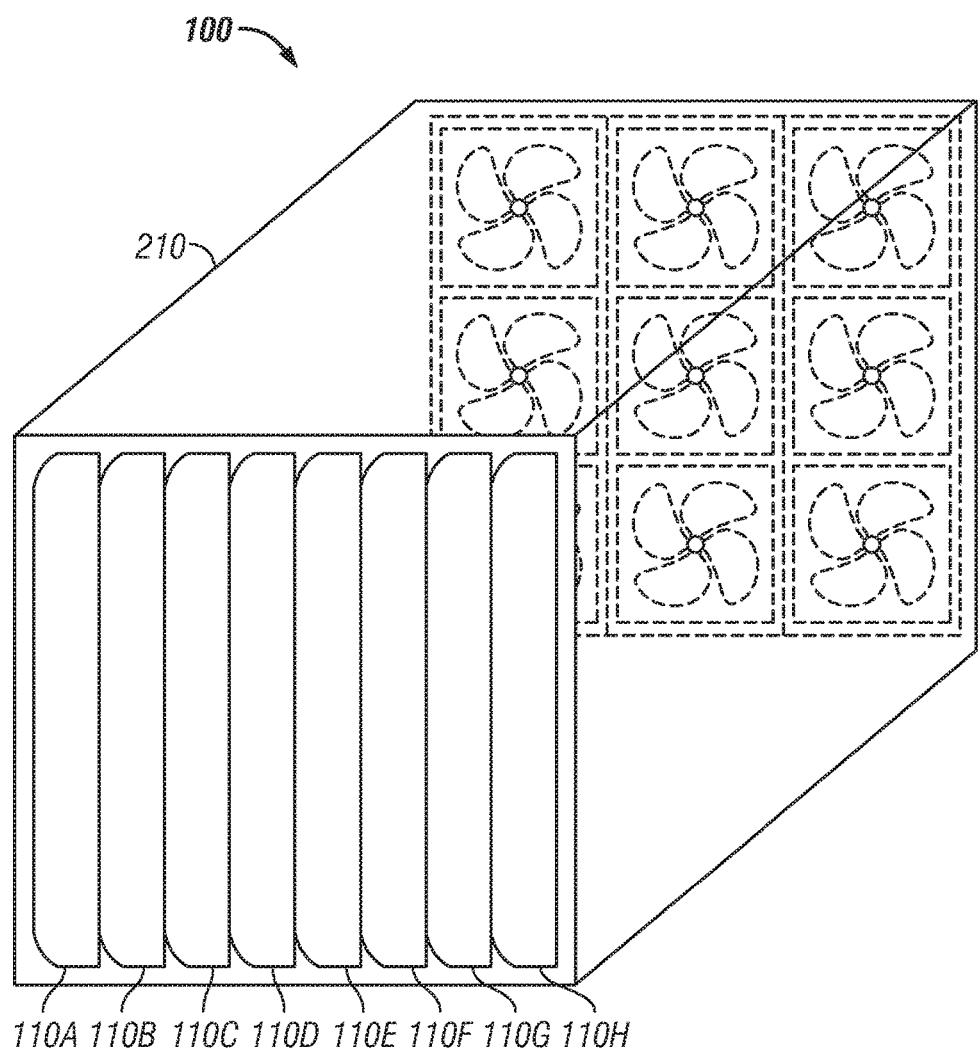
FIG. 2A illustrates a diagram of an example modular chassis, in accordance with the present disclosure.
Figure 2B:
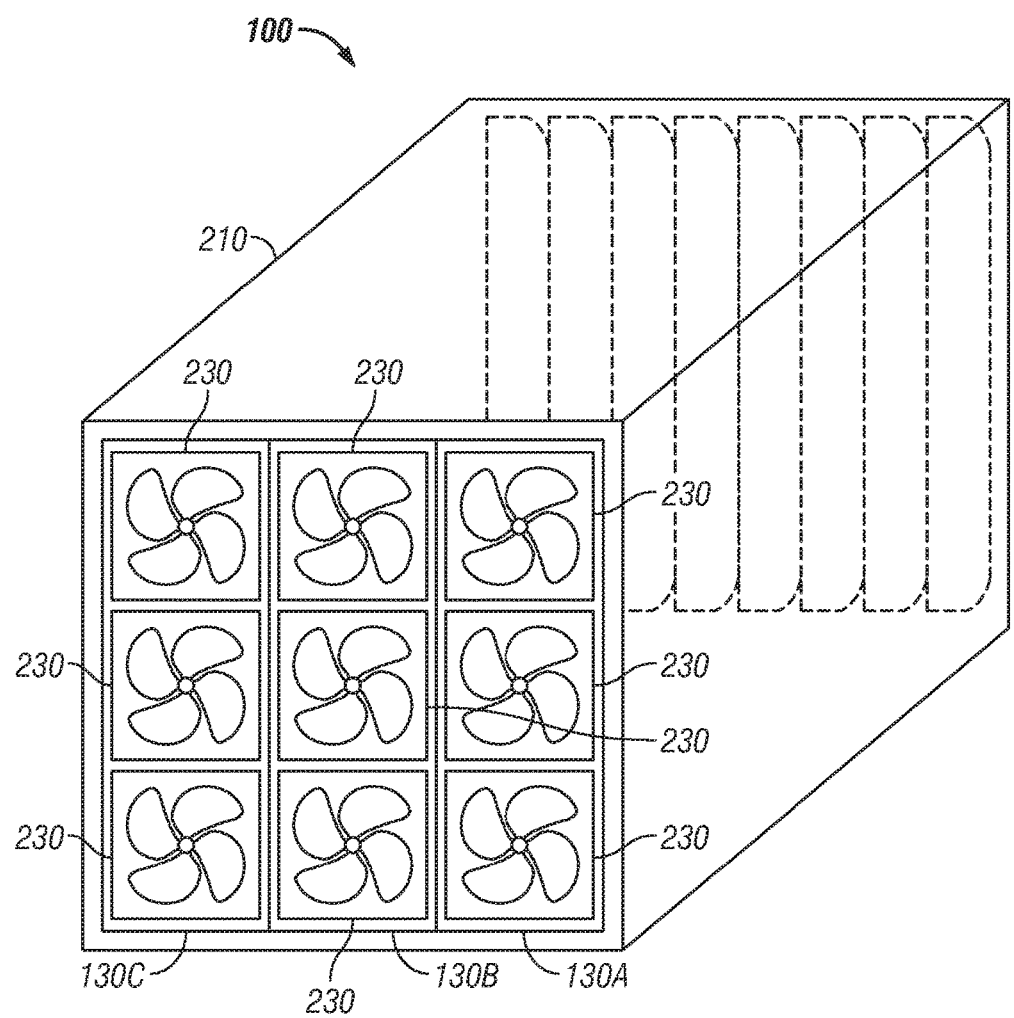
FIG. 2B illustrates a diagram of an example modular chassis in accordance with the present disclosure.

FIG. 1 illustrates a block diagram of an example information handling system 100 including servers 110A, 110B, 110C, 110D, 110E, 110F, 110G, and 110H (referred to generally as server(s) 110), chassis management controller ("CMC") 120, and cooling fan banks 130A, 130B, and 130C (referred to generally as fan bank(s) 130), all of which may be housed in a chassis 210 (shown in FIGS. 2A and 2B).

Servers 110 may be, for example, blade servers, which may include thin, modular electronic circuit boards containing one or more microprocessors, memory, and/or other server hardware and/or firmware. Blade servers may be housed in a space saving, rack-based chassis 210 (discussed below in conjunction with FIG. 2A) that may accept multiple server blades. As shown in FIG. 1, servers 110 may be communicatively coupled to CMC 120. Servers 110 may include a processor configured to analyze the hardware configuration of server 110, the thermal condition created by the software load on server 110, and the ambient temperature of server 110. The processor may then communicate the specific cooling requirements of the server 110 to CMC 120.

CMC 120 may be any system, device, or apparatus configured to facilitate management and/or control of information handling system 100. CMC 120 may be configured to issue commands and/or other signals to manage and/or control information handling system 100 and/or components of information handling system 100. For example, CMC 120 may be configured to receive cooling requirement information from servers 110 and, based on that information, transmit a fan request signal to cooling fan banks 130.

CMC 120 may comprise a microprocessor, microcontroller, DSP, ASIC, field programmable gate array ("FPGA"), EEPROM, or any combination thereof. As shown in FIG. 1, CMC 120 may be communicatively coupled to servers 110 and cooling fan banks 130. In some embodiments, CMC 120 may provide a user interface and high level controls for the management of servers 110, including configuring the mapping of servers 110 to cooling fan banks 130, which will be discussed in additional detail in conjunction with FIGS. 2A and 2B.

As shown in FIG. 2B, cooling fan banks 130A, 130B, and 130C may each include multiple cooling fans 230. Cooling fans 230 may be any mechanical or electro-mechanical fan used for cooling purposes. In certain embodiments, cooling fans 230 may draw cool air into chassis 210, and/or move air across a heatsink to cool one or more of servers 110 and/or other components of information handling system 100. Although information handling system 100 is depicted as including three cooling fan banks 130, information handling system 100 may include any number of cooling fan banks 130. Similarly, although each cooling fan banks 130 are depicted in FIG. 2B as containing three cooling fans 230, cooling fan banks 130 may be configured to include any number of cooling fans 230.

As shown in FIG. 2A, chassis 210 may be a modular chassis configured to house multiple servers 110. Although FIG. 2A depicts only eight blade servers housed in chassis 210, chassis 210 may be configured to house a larger or smaller number of servers than are depicted. Servers 110 may be cooled using front-to-back cooling, in which air is drawn into chassis 210 through servers 110. The air may pass through servers 110 before it is drawn into cooling fans 230, which may exhaust the air from chassis 210. The airflow paths through chassis 210 may be configured such that the air which flows through each server 110 may be exhausted via the cooling fans 230 in one or more of fan banks 130. Each server 110 may be logically mapped to the cooling fan banks 130 that exhaust the air that flows through the server 110. For example, in some embodiments, servers 110A and 110B may be logically mapped to cooling fan bank 130A, servers 110C and 110D may be logically mapped to cooling fan banks 130A and 130B, servers 110E and 110F may be logically mapped to cooling fan banks 130B and 130C, and servers 110G and 110H may be logically mapped to cooling fan bank 130C.

Logical mapping of servers 110 to cooling fan banks 130 permits CMC 120 to transmit a fan request signal to the correct cooling fan bank 130 based on the cooling requirement information received from a server 110. For example, the airflow from a particular server may be exhausted by one or more of cooling fan banks 130. Thus, if a particular server 110 requires an increased fan speed, it is important that CMC 120 transmit a fan request signal to a cooling fan bank 130 in the same airflow path as the server 110. By way of example, if CMC 120 receives cooling requirement information from server 110A indicating that server 110A requires a higher fan speed, CMC 120 may transmit a fan request signal to cooling fan bank 130A, through which the airflow from server 110A may be exhausted.

Figure 3:
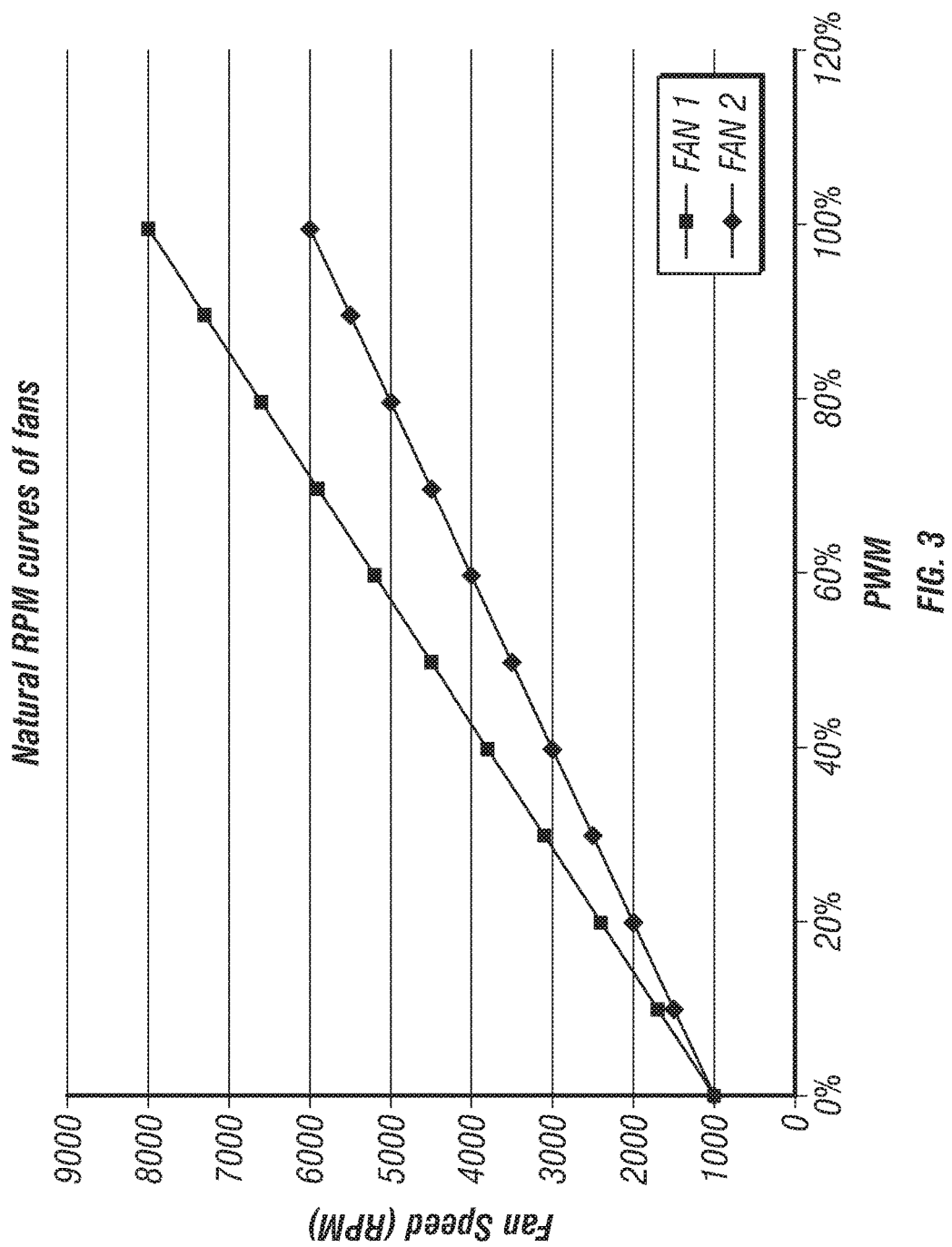
FIG. 3 illustrates an example graph of a fan speed curve for two different cooling fans.

Fan request signals sent from CMC 120 to cooling fan banks 130 may be pulse width modulation ("PWM") signals. The duty cycle of a PWM signal may refer to the proportion of time in the period that the pulse is active and may be specified as a percentage of the full period. Additionally, the duty cycle of a PWM signal may correspond with the average output value of the signal. For example, if cooling fans 230 in cooling fan bank 130 receive a PWM signal with a 50% duty cycle, cooling fans 230 may respond by running at roughly 50% of full power. Cooling fans 230 may operate in accordance with a fan speed curve such that each PWM value corresponds to a particular power level, revolutions per minute ("RPM"), and airflow. Different fan types may operate according to a different fan speed curve. For example, FIG. 3 illustrates the fan speed curve for two different fans. As shown, each PWM value corresponds to a different fan speed on each of the fan speed curves.

The cooling requirement information transmitted from servers 110 to CMC 120 may specify, based on the fan speed required by the server, a PWM signal to be sent to cooling fan 230. Each server 110 may be configured to operate with a particular type and/or generation of cooling fan. Thus, if a server 110 requires a certain fan speed, it may transmit the PWM signal corresponding to the required fan speed on the fan speed curve of the fan with which the server is configured to operate. As shown in FIG. 3, cooling fans from different generations and/or different manufacturers may, however, operate according to different fan speed curves. Thus, two fans that receive the same PWM signal may operate at a different fan speed. For example, as shown in FIG. 3, Fan 1 may be a new generation fan with a maximum fan speed of 8,000 RPM and Fan 2 may be a legacy fan with a maximum fan speed of 6,000 RPM. If both fans receive a 50% PWM signal, Fan 1 may run at 4,500 RPM, while Fan 2 may run at 3,500 RPM.

Chassis 210 may include servers 110 configured to operate with a legacy fan, but cooling fans 230 may be new generation fans. Server 110 may transmit to CMC 120 cooling requirement information, which may specify a PWM signal that corresponds to the server's required fan speed based on the fan speed curve of the legacy fan. Because cooling fans 230 have a different fan speed curve, however, the specified PWM signal may not correspond to the server's required fan speed. Consider, for example, a server 110 configured to operate with a legacy fan that operates in accordance with the fan speed curve of Fan 2 in FIG. 3. If the server requires a fan speed of approximately 3,500 RPM, it may specify a 50% PWM signal. If, however, the cooling fans 230 installed in chassis 210 are newer generation cooling fans having the fan speed curve of Fan 1, the fan speed corresponding to a 50% PWM will be approximately 4,500 RPM. In this example, the server 110 only required a fan speed of approximately 3,500 RPM; thus, a cooling fan operating at 4,500 RPM consumes excess power to operate at an unnecessarily high RPM.

To avoid excess power consumption and to deliver the expected fan speed, CMC 120 may be configured to revise the PWM signal received from server 110 such that the revised PWM signal corresponds to the required fan speed on the fan speed curve of the cooling fans 230. By revising the PWM signal in this manner, the system 100 maintains backward compatibility with legacy server blades. For example, server 110 may transmit a 50% PWM signal to CMC 120, which the server expects to correspond to a fan speed of approximately 3,500 RPM. To avoid excess power consumption, CMC 120 may revise the PWM signal and transmit a 36% PWM signal to cooling fans 230, which corresponds to a fan speed of approximately 3,500 RPM on the fan speed curve of the cooling fans 230.

CMC 120 may be configured to revise the PWM signal received from server 110 based on a predetermined algorithm. Knowing the characteristics of the type and/or generation of cooling fan for which the server is configured and the type and/or generation of cooling fans 230 installed in the chassis 210, one may determine a PWM offset that may be applied to the PWM signal received from the server to generate a revised PWM signal that corresponds to the server's required fan speed on the fan speed curve of cooling fans 230. A PWM offset table may be constructed by comparing the fan speed curves of two or more cooling fans.

As an example, consider a chassis 210 including cooling fans 230, which may be new generation cooling fans, and servers 110, which may be legacy servers configured to operate with legacy fans. Server 110 may, based on its required fan speed, transmit cooling requirement information specifying a PWM signal to CMC 120. Because server 110 is configured to operate with a legacy fan, the PWM signal specified by the server may correspond to the server's required fan speed on the fan speed curve of the legacy fan. The table below illustrates the PWM offset that may be used to revise the PWM signal submitted by servers 110 such that the resulting fan speed approximates the server's required fan speed.

| PWM | Legacy Fan RPM | Default New Fan RPM | PWM Correction Values | New Fan New RPM |
| --- | --- | --- | --- | --- |
| 0% | 1000 | 1000 | | 1000 |
| 10% | 1500 | 1700 | −3% | 1490 |
| 20% | 2000 | 2400 | −6% | 1980 |
| 30% | 2500 | 3100 | −8% | 2540 |
| 40% | 3000 | 3800 | −11% | 3030 |
| 50% | 3500 | 4500 | −14% | 3520 |
| 60% | 4000 | 5200 | −17% | 4010 |
| 70% | 4500 | 5900 | −13% | 4990 |
| 80% | 5000 | 6600 | −10% | 5900 |
| 90% | 5500 | 7300 | −7% | 6810 |
| 100% | 6000 | 8000 | 0% | 8000 |

Using the example system described above, server 110 may require a cooling fan speed of 3,500 RPM. Because server 110 is configured to operate with a legacy cooling fan, it may transmit a 50% PWM signal to CMC 120, which corresponds to a fan speed of 3,500 RPM on the fan speed curve of the legacy fan. If, however, the 50% PWM signal were transmitted to new generation fans cooling fans 230, the fans would operate at a fan speed of 4,500 RPM, which would result in unnecessary consumption of power. To avoid this, the PWM signal may be revised by applying an offset such that the revised PWM signal corresponds to the server's required fan speed on the fan speed curve of cooling fans 230. In this example, an offset of −14% would be applied to the 50% PWM signal specified by the server. Thus, a revised 36% PWM signal would be transmitted to new generation cooling fans 230.

Although the example discussed above includes servers configured to operate with two different generations of cooling fans, a chassis 210 may include servers configured to operate with cooling fans from several different generations. Thus, a PWM offset table may include offsets that may be applied to the PWM signal received from each of the servers to generate a revised PWM signal that corresponds to the server's required fan speed on the fan speed curve of cooling fans 230.

Figure 4:
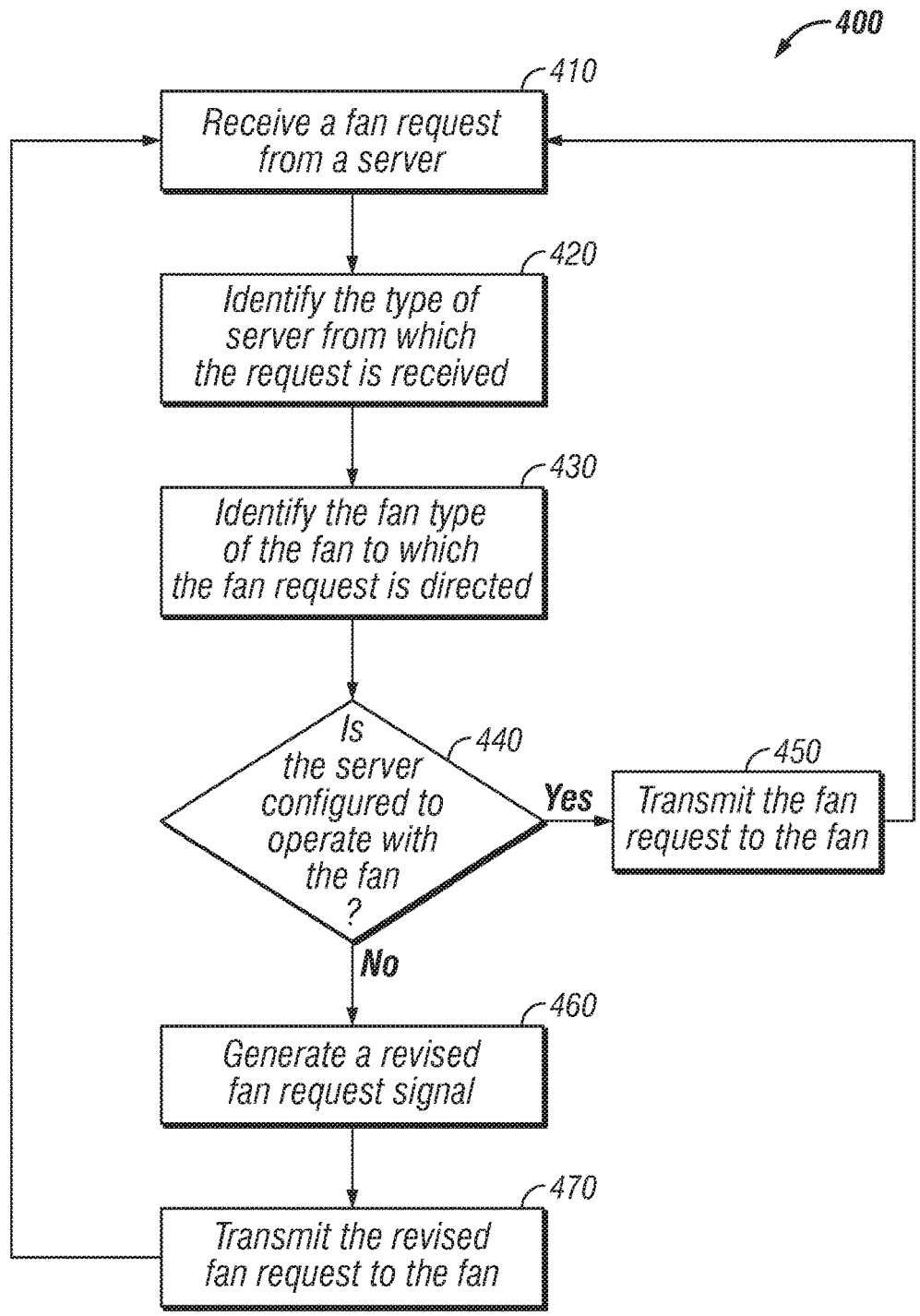
FIG. 4 illustrates an example method of controlling an air mover, in accordance with the present disclosure.

FIG. 4 illustrates an example method 400 of controlling an air mover (e.g., a cooling fan) to maintain backward compatibility in a modular server chassis 210 including a plurality of servers 110, a CMC 120, and a plurality of cooling fans 230.

At step 410, the CMC may receive a fan request signal from a server 110. The fan request signal may include a PWM signal that, based on the fan speed curve of the fan type with which server 110 is configured to operate, corresponds with the server's required fan speed. At step 420, CMC 120 may identify the server type of server 110. CMC 120 may be provided with the server type for server 110 by the system administrator upon initialization of the system 100. Alternatively, server 110 may, upon initialization identify itself to CMC 120 by communicating its server type to CMC 120. Server type may be used to designate a particular model, brand, or generation of server. Based on the server type of server 110, CMC 120 may use a lookup table to determine the fan type with which server 110 is configured to operate. The fan type may designate a particular model, brand, generation, or class of cooling fan. Alternatively, server 110 may be configured to communicate to CMC 120 the fan type with which it is configured to operate.

At step 430, CMC 120 may identify the fan type of the cooling fans 230 to which the fan request signal is directed. CMC 120 may be provided with the fan type for cooling fans 230 by the system administrator upon initialization of the system 100. Alternatively, CMC 120 may transmit a signal to cooling fans 230 that permits CMC 120 to identify the fan type of cooling fans 230. For example, each fan type may have a particular resistance value. If CMC 120 transmits an electrical current to cooling fans 230, it may measure the resistance of cooling fans 230 and identify the corresponding fan type.

At step 440, CMC 120 may determine whether server 110 is configured to operate with the fan type of cooling fans 230. To make this determination, CMC 120 may compare the fan type with which the server 110 is configured to operate (identified at step 520) with the fan type of cooling fans 230. If the fan types are the same, server 110 may be configured to operate with cooling fans 230 and the method may proceed to step 550. Alternatively, CMC 120 may compare the fan speed curve of cooling fans 230 to the fan speed curve of the fan type with which server 110 is configured to operate. If the fan speed curves are equivalent, server 110 may be configured to operate with cooling fans 230, and the method may proceed to step 450.

At step 450, CMC 120 may transmit the fan request signal to cooling fans 230. Following transmission of the fan request signal, the method may return to step 510 and may be repeated for another fan request signal received from the same or a different server 110.

If, on the other hand, server 110 is not configured to operate with cooling fans 230, the method may proceed to step 460. At step 460, CMC 120 may revise the fan request signal such that it corresponds with the intended fan speed of server 110 on the fan-speed curve of cooling fans 230. As discussed above, if the fan request signal includes a PWM signal, CMC 120 may apply a predetermined algorithm to generate a revised fan request signal including a revised PWM signal corresponding to the server's required fan speed on the fan speed curve of cooling fans 230. For example, CMC 120 may use a PWM offset table to identify an offset that may be applied to the PWM signal received from the server to generate a revised PWM signal that corresponds to the server's required fan speed on the fan speed curve of cooling fans 230.

At step 470, CMC 120 may transmit the revised fan request signal to cooling fans 230. Following transmission of the revised fan request signal, the method may return to step 510 and may be repeated for another fan request signal received from the same or a different server 110.

Although the present disclosure has been described in detail, it should be understood that various changes, substitutions, and alterations can be made hereto without departing from the spirit and the scope of the disclosure as defined by the appended claims.

What is claimed is:

1. A method of controlling a cooling fan in an information handling system, the method comprising:
    receiving a fan request signal from a component of an information handling system;
    identifying a fan type of the cooling fan;
    determining whether the component is configured to operate with a cooling fan based on the fan type of the cooling fan;
    if the component is configured to operate with the cooling fan, transmitting the fan request signal to the cooling fan; and
    if the component is not configured to operate with the cooling fan, generating a revised fan request signal and transmitting the revised fan request signal to the cooling fan.

2. The method of claim 1, wherein the component of the information handling system is a server.

3. The method of claim 1, wherein determining whether the component is configured to operate with the cooling fan:
    identifying a fan type of the cooling fan;
    identifying a fan type of a fan with which the server is configured to operate;
    comparing a fan-speed curve of the cooling fan to a fan-speed curve of the fan with which the server is configured to operate; and
    determining, based on the comparison, whether the component is configured to operate with the cooling fan.

4. The method of claim 1, wherein the fan request signal is a pulse width modulation signal.

5. The method of claim 1, wherein generating a revised fan request signal comprises:
    identifying a required fan speed of the component, wherein identifying a required fan speed comprises identifying an intended fan speed; and
    generating a revised fan request signal based on the intended fan speed.

6. The method of claim 5, wherein generating a revised fan request signal further comprises:
    identifying the intended fan speed of the component, wherein identifying the required fan speed comprises identifying a fan speed corresponding to the received fan request signal in an offset table;
    identifying an offset corresponding to the intended fan speed in the offset table; and
    generating a revised fan request signal by applying the offset to the received fan request signal.

7. The method of claim 5, wherein generating a revised fan request signal further comprises:
    identifying the intended fan speed of the component, wherein identifying the intended fan speed comprises identifying a fan speed corresponding to the received fan request signal on a fan-speed curve of a fan with which the component is configured to operate; and
    generating a revised fan request signal based on the intended fan speed, wherein the revised fan request signal corresponds to the intended fan speed on a fan-speed curve of the cooling fan.

* * * * *